United States Patent
Coban

(10) Patent No.: US 10,033,364 B1
(45) Date of Patent: Jul. 24, 2018

(54) LOW POWER COMPACT PEAK DETECTOR WITH IMPROVED ACCURACY

(71) Applicant: SILICON LABORATORIES INC., Austin, TX (US)

(72) Inventor: Abdulkerim L. Coban, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/609,160

(22) Filed: May 31, 2017

(51) Int. Cl.
| | |
|---|---|
| *H03D 1/00* | (2006.01) |
| *H04L 27/06* | (2006.01) |
| *H03K 5/1532* | (2006.01) |
| *H03G 3/20* | (2006.01) |
| *H04B 1/16* | (2006.01) |

(52) U.S. Cl.
CPC ............ *H03K 5/1532* (2013.01); *H03G 3/20* (2013.01); *H04B 1/16* (2013.01)

(58) Field of Classification Search
CPC ...... H03K 5/1532; H03G 3/20; H03G 3/3052; H04B 1/16; H04B 1/04; H03F 1/0233; H03F 1/0222
USPC .................................. 375/340, 377, 316, 317
See application file for complete search history.

(56) References Cited

U.S. PATENT DOCUMENTS

| | | | | |
|---|---|---|---|---|
| 8,107,913 | B1 * | 1/2012 | Nathawad | ............ H03G 3/3052 |
| | | | | 455/255 |
| 8,761,300 | B2 * | 6/2014 | Mirzaei | .................... H04B 1/04 |
| | | | | 327/58 |
| 8,854,130 | B2 | 10/2014 | Coban et al. | |
| 2016/0072447 | A1 * | 3/2016 | Seth | ...................... H03F 1/0222 |
| | | | | 330/259 |
| 2017/0214367 | A1 * | 7/2017 | Deo | ...................... H03F 1/0233 |

OTHER PUBLICATIONS

Nagaraj, Krhishnaswamy et al. "A Median Peak Detecting Analog Signal Processor for Hard Disk Drive Servo" IEEE Journal of Solid-State Circuits, vol. 30, No. 4, Apr. 1995. pp. 461-470.

* cited by examiner

*Primary Examiner* — Phuong Phu
(74) *Attorney, Agent, or Firm* — Gary Stanford; Huffman Law Group, PC

(57) ABSTRACT

A peak detector including an input circuit with five same-sized transistors, in which four of the input transistors are coupled in parallel between a control node and a bias node and receive a corresponding one of two in-phase signals and two quadrature signals. The fifth transistor is coupled between a current node and the bias node and has its control terminal coupled to an output node. A bias circuit establishes a predetermined bias current that flows through the five input transistors. A current mirror mirrors the current through the fifth transistor from the current terminal into the four parallel-coupled input transistors via the control node. An output circuit charges a peak capacitor based on voltage developed at the control terminal of the fifth transistor. The peak detector is low power and compact and detects the actual peak of the input signal with greater accuracy compared to a conventional peak detector.

20 Claims, 2 Drawing Sheets

LOW POWER COMPACT PEAK DETECTOR WITH IMPROVED ACCURACY

BACKGROUND OF THE INVENTION

Field of the Invention

The present invention relates in general to peak detectors, and more particularly to a peak detector that consumes less space and power, that has wider tracking bandwidth, and that detects the actual peak with improved accuracy.

Description of the Related Art

A peak detector is often used in the receiver chain of various communication products using either wired or wireless communications. It may be used, for example, as part of an automatic gain control (AGC) loop for ensuring the signal level of a received wireless signal is near a target level. In many communication systems, a received radio frequency (RF) signal is downconverted by the receiver to an intermediate frequency (IF) signal, which is then downconverted to a baseband signal. In other system configurations, the RF signal may be directly downconverted to baseband. In either case, one or more comparators may be used to compare in-phase (I) or quadrature pase (Q) differential signals at IF or baseband against one or more threshold windows. The peak detector samples or detects the envelop or peak level of the I and/or Q signals. The comparator results may be sampled and quantized at intervals to determine whether the signal level is at or near the target level.

The comparator power consumption is typically set by accuracy and tracking bandwidth requirements which can be high in the case of strong far-out blocker signals. A quantizer or the like may be included to convert the output of the peak detector to binary information indicating whether the signal is above or below a threshold. If it is desired to find out how far the signal is from a target level, multiple peak detectors may be used. In many conventional configurations with quadrature inputs, the peak detector can measure the peak up to 3 decibels (dB) lower than the actual peak depending upon the relationship between signal frequency and observation time. If the signal frequency is relatively low and/or the observation time is relatively short, the probability of observing the signal envelop at its lowest point (e.g., a 3 dB down point) increases particularly in the presence of blocker signals. For example, if a blocker signal is sufficiently close to DC (direct current) when downconverted to IF or baseband and if the observation time is relatively short for each gain change during AGC settling, there is a relatively strong possibility of reading the peak up to 3 dB lower than its actual value.

It is appreciated that incorrectly detecting the actual peak level may cause a significant delay in accurately detecting and capturing the received signal. Assume, for example, a target voltage level of $VP_{TARGET}$, and a quadrature sinusoidal input signal with a constant amplitude and having an actual peak voltage $VP_{ACTUAL}$ that is equal to the target peak level, or $VP_{ACTUAL} = VP_{TARGET}$. In this case, since the actual signal level is at the target level, no correction is necessary. The conventional peak detector, however, may incorrectly measure the peak at a reduced level, even down to about $0.71 * VP_{ACTUAL}$, which is 3 dB below the actual peak value. In response, the AGC loop may increase the gain in an attempt to amplify the signal to the target voltage level. Since the measured peak level is significantly below the actual peak level, the received signal may be over-amplified which may cause the amplified input signal to exceed the maximum allowable voltage level of the receiver. In that case, the input signal is likely clipped and input information is lost.

SUMMARY OF THE INVENTION

A peak detector according to one embodiment includes an input circuit, a bias circuit, a current mirror and an output circuit. The input circuit includes five transistors, in which four of the input transistors are coupled in parallel between a control node and a bias node and each receives a corresponding one of first and second in-phase (I) signals and first and second quadrature phase (Q) signals. The fifth transistor is coupled between a current node and the bias node and has its control terminal coupled to an output node. The five input transistors are configured to have the same size. The bias circuit is coupled to the bias node and develops a bias current that determines total current flowing through the five input transistors. The current mirror mirrors current flowing through the fifth transistor into the four other transistors, meaning that half the bias current flows through the fifth transistor while the other half is split between whichever of the other four transistors is activated at any given time. The output circuit includes an additional transistor coupled between a source voltage node and the output node and a capacitor coupled between the output node and a reference node (e.g., ground).

The I and Q signals are each differential sinusoidal signals, in which the two components of the differential I signal are 180 degrees out of phase with each other, the differential Q signal are 180 degrees out of phase with each other, and the I and Q differential signals are one-quarter period (90 degrees) out of phase with each other. Given that the input transistors are square-law devices, and given the phase relationship of the input signals, only one of the corresponding transistor tends to draw most, if not all, of the current when one component of the input signals is larger than the others. When two of the component signals have the same voltage, the current splits between the transistors. In a conventional peak detector including two different 2-input peak detectors, this may cause a peak measurement error of up to 3 decibels below the actual peak level (i.e., the "3 dB down point"), which is of particular concern when the period of the input signal is high compared to the observation window of the peak detector. The present peak detector, however, corrects for this error and more accurately detects the actual peak level of the input signals. Since the current through the fifth resistor is twice that of the two other input transistors activated at the 3 dB down point, the output is driven higher and thus closer to the actual peak level.

In one embodiment, the five input transistors are each configured to have a gate overdrive voltage that is equal to a target peak voltage of the input signals. In this case, when the observation window occurs at the 3 dB down point and when the actual peak is about the same as the target peak level, the output is actually driven to the actual peak level thereby minimizing error. Even when the actual peak voltage deviates from the target level, the amount of error is reduced as compared to conventional configurations.

An electronic circuit incorporating the peak detector as described herein may further include a quantizer that converts a voltage developed on the output node to a digital value. The electronic circuit may also include an RF frontend that receives and converts a radio signal into differential baseband (or IF) in-phase signals and quadrature phase signals, a first programmable gain amplifier that amplifies the differential in-phase signals into the first and second in-phase signals, and a second programmable gain amplifier that amplifies the quadrature phase signals into first and second quadrature phase signals. The peak value developed on the output node may be used to control a gain of the first and second programmable gain amplifiers, such as an AGC loop or the like.

A method of detecting a peak level of in-phase and quadrature phase sinusoidal differential signals according to one embodiment includes providing a corresponding one component of the in-phase and quadrature phase sinusoidal differential signals to a control terminal of a corresponding one of first, second, third, and fourth transistors of a first conductivity type having a common size and having current terminals coupled in parallel between a control node and a bias node, coupling current terminals of a fifth transistor of the first conductivity type between a current node and the bias node and coupling a control terminal of the fifth transistor to an output node, in which the first transistor is the same size as the first, second, third, and fourth transistors of the first conductivity type, drawing a predetermined bias current from the bias node, mirroring a current flowing through the current terminals of the fifth transistor of the first conductivity type through the current terminals of the first, second, third, and fourth transistors of the first conductivity type, coupling current terminals of a first transistor of a second conductivity type between a source voltage node and the output node and coupling a control terminal of the first transistor of the second conductivity type to the control node, and coupling a capacitor between the output node and a reference node.

The method may include configuring a gate overdrive voltage of the first, second, third, fourth, and fifth transistors of the first conductivity type to be equal to a target peak voltage of the in-phase and quadrature phase sinusoidal differential signals.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventor has recognized the need to improve the accuracy of peak detectors, including those used in an AGC loop of a receiver. He has also recognized the ongoing need for efficiency in terms of an electronic circuit implementation and power consumption. He has therefore developed a low power compact peak detector with improved accuracy.

The inventor has developed a 4-input peak detector that is about the same size as the conventional 2-input peak detector and that draws the same level of current. The 4-input peak detector thus replaces the function of two separate conventional peak detectors thereby cutting both area and power consumption in half. Also, the novel 4-input peak detector significantly increases tracking bandwidth thus allowing accurate peak measurement for higher frequency signals. Furthermore, even when the signal is observed at or near the lowest point, accuracy is substantially improved as compared to the conventional configuration.

Figure 1:
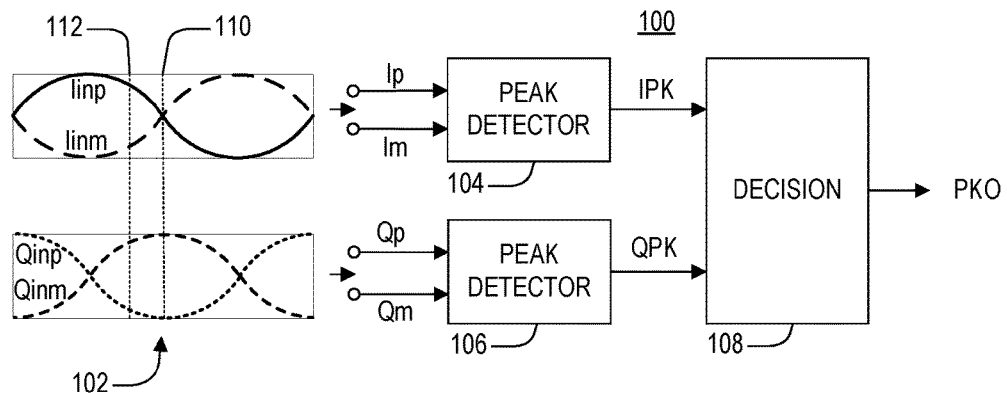
FIG. 1 is a simplified block diagram of a conventional peak detector.

FIG. 1 is a simplified block diagram of a conventional peak detector 100 of a differential I/Q input signal. As shown at 102, a differential I input signal includes a positive component Iinp and a negative component Iinm, and, similarly, a differential Q signal includes a positive component Qinp and a negative component Qinm. The positive and negative components of each differential signal are shown as simple sinusoid signals that are 180 degrees out of phase with respect to each other. Also, the I and Q signals are one-quarter period (e.g., 90 degrees) out of phase with respect to each other. The differential I signal is amplified within a corresponding I channel and provided to a first 2-input peak detector 104 as corresponding Ip/Im component signals, and the differential Q signal is amplified within a corresponding Q channel and provided to a second 2-input peak detector 106 as corresponding Qp/Qm component signals (where it is understood that Ip and Im have the same shape and phase as Iinp and Iinm, respectively, while Qp and Qm have the same shape and phase as Qinp and Qinm, respectively). The first peak detector 104 provides a first peak signal IPK indicating the highest observed level of the Ip and Im components of the differential I signal, and the second peak detector 106 provides a second peak signal QPK indicating the highest observed level of the Qp and Qm components of the differential Q signal. IPK and QPK are provided to respective inputs of a decision circuit 108, which selects the largest of the two input values to provide a measured output peak signal PKO. Although not shown, PKO may be provided to a quantizer circuit (not shown), which develops a corresponding digital signal provided to an AGC loop for controlling the relative gain of the Ip/Im and Qp/Qm input signals.

Consider an observation window around time instant 110. Although Ip and Im are observed at zero crossing, Qm is at its peak at time 110 so that QPK, and thus PKO, is developed to reflect the actual peak level of the differential IQ signals. It is appreciated, however, that each of the peak detectors 104 and 106 observes its corresponding differential input signal during an observation period rather than only a specific point in time. In this manner, if the frequency of the differential IQ signals is relatively high compared to the observation period, then the actual peak of at least one of the component signals is observed so that PKO may reflect the actual peak value of the differential IQ signals. For example, if the observation period has a duration that is at least one-fourth period of the differential IQ signals, then the peak level of at least one of the component signals is observed so that PKO accurately reflects the actual peak level. As the relative frequency of the input signal is reduced and/or the observation time of the input signal is reduced, however, the likelihood of detecting the actual peak level of the input signal is reduced.

A worst case observation window around time instant 112 illustrates the condition in which Ip and Qm are both at 3 dB below their actual peak values. Given an actual peak voltage $VP_{ACTUAL}$, the worst case observation time window around time instant 112 instead detects the differential IQ signals at a 3 dB down point, so that PKO≈VP/√2≈0.71*$VP_{ACTUAL}$, which is almost 30% lower than $VP_{ACTUAL}$. In this manner, under relatively common operating conditions, the peak detector 100 with a pair of conventional 2-input peak detectors separately monitoring the differential I and Q signals may incorrectly output a measured peak value PKO that is up to 3 dB below the actual peak level, referred to herein as the "3 dB down point." Generally, the lower the the input frequency with respect to the observation time, the greater the probability that the observation period occurs at or near the 3 dB down point, particularly when a down converted blocker signal is very close to DC in an IF chain. At least one problem with measuring the peak voltage too low is increased settling time of the AGC loop, and possible clipping of the input signal.

Figure 2:
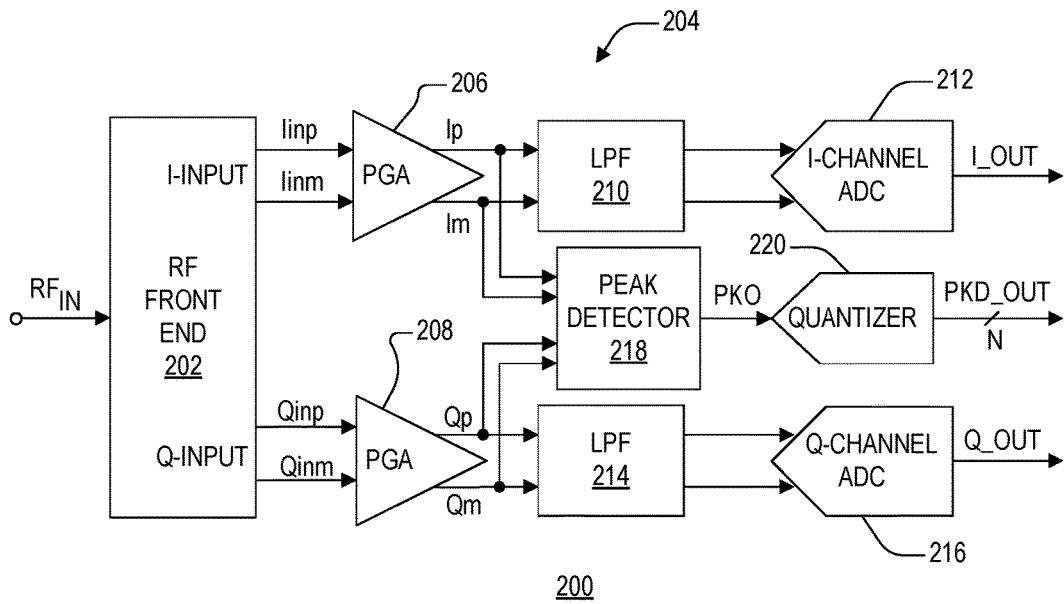
FIG. 2 is a simplified block diagram of a receiver chain implemented according to an embodiment of the present invention including a 4-input peak detector.

FIG. 2 is a simplified block diagram of a receiver chain 200 implemented according to an embodiment of the present invention including a 4-input peak detector 218. The receiver chain 200 may be used in various applications, such as television receivers, cellular phones, modems, satellite radios, network devices, etc. The receiver chain 200 may be used in both wired and wireless communication systems, in which wireless communication systems may include, for example, Bluetooth®, Zigbee®, Wi-Fi, etc. The illustrated receiver chain 200 includes an RF front-end 202 receiving an RF input signal $RF_{IN}$ and a baseband chain 204 providing I and Q output signals in response to the RF input signal $RF_{IN}$. The present invention is equally applicable to IF signals in which the baseband chain 204 may be replaced by a corresponding IF chain (where it is noted that an IF chain may have the same topology as a baseband chain except that the IF chain filter bandwidth is set wider).

The RF front-end 202 converts $RF_{IN}$ into a differential I signal provided within an I channel and a differential Q signal provided within a Q channel. In a similar manner as shown in FIG. 1, the differential I signal includes a positive component Iinp and a negative component Iinm, and the differential Q signal includes a positive component Qinp and a negative component Qinm. The differential I signal is provided to the input of a first programmable gain amplifier (PGA) 206, which outputs corresponding component signals Ip and Im, and the differential Q signal is provided to the input of a second PGA 208, which outputs corresponding component signals Qp and Qm. The I channel further includes a filter 210 (e.g., a low-pass filter LPF) that receives and filters the Ip/Im signals to provide a filtered differential I signal to an I-channel analog-to-digital converter (ADC) 212. The ADC 212 converts the filtered differential I signal to an output signal I_OUT. In a similar manner, the Q channel further includes a filter 214 (e.g., a low-pass filter LPF) that receives and filters the Qp/Qm signals to provide a filtered differential Q signal to a Q-channel ADC 216. The ADC 216 converts the filtered differential Q signal to an output signal Q_OUT.

The Ip/Im and Qp/Qm component signal pairs are also provided to respective inputs of the peak detector 218. As described further herein, the peak detector 218 senses the peak level of the I and Q differential input signals (via the Ip/Im and Qp/Qm component signal pairs) and develops the PKO signal indicative of a peak magnitude of the I and Q differential input signals. PKO may be used an AGC loop that adjusts the gain of PGA 206 and PGA 208 or the gain of a block residing in the preceding RF front-end 202 to provide Ip/Im and Qp/Qm at or near a target input signal level. In one embodiment, PKO may be used directly for finer gain adjustments in the AGC loop.

In the illustrated embodiment, PKO is further provided to the input of a quantizer 220, which provides a digital output PKD_OUT with one or more levels or steps used for course gain adjustments. The number of steps may be determined by the particular configuration, which may include only two steps ("too high" or "too low"), or may include more levels depending upon the desired level of granularity (e.g., 3 steps, 5 steps, 10 steps, etc.). The levels may have linear or non-linear variation, such as uniform voltage levels (100 mV steps) or dB-uniform steps, such as 1 dB steps, 3 dB steps, etc. The quantizer 220 may be implemented as a coarse quantizer which could be a single comparator. In another embodiment, the quantizer 220 may include a flash ADC with clocked comparators. In another embodiment, the quantizer 220 includes a flash ADC with static comparators and a set-reset (SR) output latch. PKD_OUT has "N" bits in which N is an integer number greater than zero. The actual value of N depends upon the particular application and implementation. Although not shown, PKD_OUT may be provided to the AGC loop to adjusts the gain of PGA 206 and PGA 208 or the gain of a block residing in the preceding RF front-end 202 to provide Ip/Im and Qp/Qm at or near a target input signal level.

An important aspect of quantization of the peak detect signal is that adjustments of the AGC loop may be relatively course as compared to analog configurations. The accuracy of the peak detector may become a significant factor in AGC loop operation in the event of a large discrepancy between the measured peak level and the actual peak level. For example, the conventional peak detector may exhibit up to a 3 dB error under common operation conditions, which may cause the AGC loop to overcompensate or undercompensate loop gain adjustment, potentially resulting in receiver chain saturation or even instability which may result in longer AGC settling time. The peak detector 218 as described herein significantly reduces peak measurement error, thereby minimizing AGC loop operation errors. The peak detector 218 is illustrated within a receiver of a communication system, although it is understood that the peak detector 218 may be used ain any electronic circuit that processes in-phase and quadrature signals.

Figure 3:
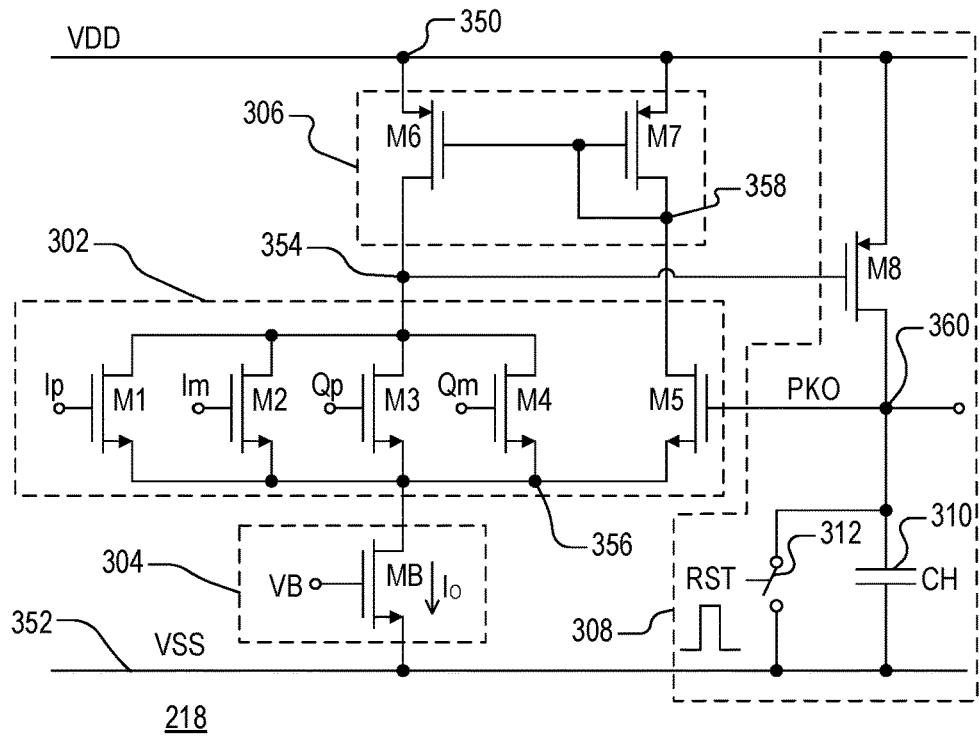
FIG. 3 is a more detailed schematic diagram of the peak detector of FIG. 2 implemented according to one embodiment of the present invention.

FIG. 3 is a more detailed schematic diagram of the peak detector 218 implemented according to one embodiment of the present invention. The peak detector 218 includes an input circuit 302, a bias circuit 304, a current mirror 306, and an output circuit 308 coupled between a source voltage node 350 and a source reference voltage node 352. The source voltage node 350 develops a source voltage VDD and the source reference voltage node 352 develops a voltage VSS. It is understood that VDD and VSS are source voltages, in which VSS has a reference voltage level relative to VDD. Generally, VSS may be ground or be 0 Volts (V), although VSS may have any other positive or negative voltage level, whereas VDD is established at a source offset voltage relative to VSS at least sufficient to provide power for proper circuit operation.

The input circuit 302 includes five N-type input transistors M1, M2, M3, M4, and M5. The input transistors M1-M5 are each configured as the same type and the same size. Thus, each of the transistors M1-M5 are the same as each other with the same channed width W and the same channel length L, so that W/L is also equal. The transistors M1-M4 have a drain terminal coupled to a control node 354 and a source terminal coupled to a bias node 356. Ip is provided to the gate terminal of M1, Im is provided to the gate terminal of M2, Qp is provided to the gate terminal of M3, and Qm is provided to the gate terminal of M4. M5 has its drain terminal coupled to a current node 358, its source terminal coupled to the bias node 356, and its gate terminal coupled to an output node 360 developing a peak output voltage PKO.

The bias circuit 304 is coupled between the bias node 356 and VSS. In the illustrated embodiment, the bias circuit 304 is implemented with an N-type transistor MB having its drain terminal coupled to the bias node 356, its source terminal coupled to VSS, and its gate terminal receiving a bias voltage VB. In operation, VB is set to an appropriate bias voltage level to develop a corresponding predetermined bias current $I_O$ through MB.

The current mirror 306 is coupled between VDD and the control node 354. In the illustrated embodiment, the current mirror 306 includes P-type transistors M6 and M7 coupled in a current mirror configuration. In particular, the source terminals of M6 and M7 are coupled to VDD, the drain terminal of M6 is coupled to the control node 354, and the gate and drain terminals of M7 and the gate terminal of M6 are coupled together at a current node 358. In this manner, the current through M7 is mirrored through M6 to the control node 354 during operation.

The output circuit 308 includes a P-type transistor M8, a capacitor 310, and a single-pole, single-throw (SPST) reset switch 312. M8 has its source terminal coupled to VDD, its gate terminal coupled to the control node 354, and its drain terminal coupled to the output node 360. The capacitor 310 and the reset switch 312 are coupled in parallel between the output node 360 and VSS. The capacitor 310 has a hold capacitance CH, and may be implemented as a single capacitor as shown, or with multiple capacitors or any other suitable voltage storage device or circuit. The reset switch 312 is controlled by a reset signal RST, in which the reset switch 312 is open when RST is negated low and closed when RST is asserted high. In operation, RST is negated low during an observation period in which the capacitor 310 charges to the voltage of node 360 to develop PKO, and RST is pulsed high between consecutive observation periods to discharge or otherwise short the capacitor 310. In this manner, the voltage of PKO is pulled to VSS between observation periods.

It is noted that each of the transistors of the peak detector 218 as described herein are either N-type or P-type transistors, each including two current terminals (e.g., drain and source terminals), and a control terminal (e.g., gate terminal). In the illustrated configuration, each transistor may be configured as a MOS transistor or a FET or the like, including any one of various configurations of MOSFETs and the like. For example, the N-type transistors (e.g., M1-M5) may be NMOS transistors or NFETs, and the P-type transistors (e.g., M6-M8) may be PMOS transistors or PFETs.

In operation of the peak detector 218, the bias current $I_O$ establishes the total current through the transistors M1-M5. The current mirror 306 splits the current so that about half of the bias current $I_O$ flows through M5, and the other half flows through one or two of the transistors M1-M4 depending upon the relative voltage levels of Ip/Im and Qp/Qm. As described further herein, only one of the transistors M1-M4 is turned on when a corresponding one of the component voltages Ip/Im and Qp/Qm is at a higher voltage than the other component voltages (with some margin). For example, with reference to the component voltages shown at 102 in FIG. 1, when Ip is at its peak level, then M1 is turned on and M2-M4 are turned off. When two of the component voltages are substantially equal to each other and greater than the other two component voltages, then the current is split between the corresponding two of the transistors M1-M4. For example, at the time point 112, Ip and Qm are substantially equal at a relatively high voltage while Im and Qp are at relatively low voltage, M1 and M4 are turned on while M2 and M3 are turned off. The gate voltage of M5 is driven to reflect the peak level of the component voltages as further described herein, and M8 charges the capacitor 310 to the peak level. The reset switch 312 discharges the capacitor 310 to VSS when RST is asserted high between observation periods.

The peak detector 218 provides several significant advantages over the pair of 2-input peak detectors 104 and 106 of the conventional peak detector 100. First, the peak detector 218 may have a similar configuration as each of the peak detectors 104 and 106, except that the input circuit 302 includes additional transistors to receive all four component signals. In this manner, the size of the peak detector 218 is comparable to either of the peak detectors 104 and 106, and thus is only about one-half the size of the combined pair of peak detectors 104 and 106. Second, since the peak detector 218 provides only one output, the decision circuit 108 can be eliminated. Third, the current flowing through the peak detector 218 is about the same as either one of the peak detectors 104 and 106, so that the peak detector 218 consumes only about one-half the power of the combined pair of peak detectors 104 and 106. Fourth, since the peak detector 218 combines all four component signals into one, the peak detector 218 has significantly wider tracking bandwidth, has reduced ripple (since peaks occur twice as often), and provides more accurate results for signals that have much longer periods (or equivalently low frequency signals) than the observation time. Fifth, as further described herein, even when the peak detector 218 observes a 3 dB down point of the input signal, the output voltage is not driven to 3 dB below the actual peak, but is more accurate with less error. Assuming square-law input devices, if a gate overdrive voltage $V_{OV}$ of each of the transistors M1-M5 is set equal to a predetermined target peak voltage $VP_{TARGET}$, then when the actual peak voltage $VP_{ACTUAL}$ is near $VP_{TARGET}$, the output PKO is at or near $VP_{ACTUAL}$ rather than 3 dB down. Also, even if $VP_{ACTUAL}$ varies from $VP_{TARGET}$ by as much as 50% (e.g., $VP_{TARGET}/1.5 \leq VP_{ACTUAL} \leq 1.5*VP_{TARGET}$), the error of PKO is only about 1 dB rather than 3 dB.

Each of the transistors M1-M5 operate as a "square-law" device in which its current, $I_D$, is proportional to the square of its gate overdrive voltage $V_{OV}$ (a.k.a., saturation voltage $V_{DSAT}$), in which $V_{OV}$ is the difference between the gain-source voltage $V_{GS}$ and its threshold voltage $V_T$ as illustrated by the following equation (1):

$$I_D \propto V_{OV}^2 = (V_{GS} - V_T)^2 \qquad (1)$$

As a consequence of this relationship, when two or more transistors are placed in parallel with each other, the current splits about equally when the gate voltages are the same and $V_{OV}$ scales down by a factor of $\sqrt{2}$. However, when one of the gate voltages is significantly larger, the corresponding transistor tends to draw most, if not all, of the current.

In the case of the conventional peak detectors 104 and 106, since Ip and Im (following Iinp and Iinm, respectively) or Qp and Qm (following Qinp and Qinm, respectively) vary out of phase with respect to each other as shown at 102, only one of the input transistors within each peak detector is active most of the time. At time point 110, however, the peak detector 104 with inputs Ip and Im provides the lowest level of peak value since both values are at zero crossing. Nonetheless, at this point Qm is at $VP_{ACTUAL}$ so that QPK is also about $VP_{ACTUAL}$. Thus, a relatively accurate measure of PKO=$VP_{ACTUAL}$ is obtained. At time point 112, however, only one of the input transistors of the peak detector 104 is on at the 3 dB down point reflecting the level of Ip, and only one of the input transistors of the peak detector 106 is on at the 3 dB down point reflecting the level of Qm. Since both are at the 3 dB down point, the decision circuit 108 asserts PKO at the 3 dB down point providing an inaccurate peak level determination.

The peak detector 218 minimizes inaccurate peak measurement at the 3 dB down point for any frequency level of the input signal. At any given 3 dB down point, one of the Ip/Im component voltages is 3 dB down and one of the Qp/Qm component voltages is also 3 dB down (e.g., Ip and Qm, or Im and Qp), so that two of the input transistors M1-M4 are turned on thereby splitting the current sourced from the control node 354. The total current through the transistors M1-M5 is $I_O$ in which M5 draws half the current, or $I_O/2$, so that a current of $I_O/4$ flows through each of the activated pair of input transistors. It can be shown that PKO is according to the following equation (2):

$$PKO = \frac{VP_{ACTUAL}}{\sqrt{2}} + \left(1 - \frac{1}{\sqrt{2}}\right)V_{OV} \quad (2)$$

Since $VP_{ACTUAL}/\sqrt{2}$ is the 3 dB down point, PKO is increased by a factor of about $0.29*V_{OV}$, so that accuracy of the peak measurement is improved regardless of the value of $V_{OV}$. Based on the relationship of equation (2), it can be shown that PKO follows the input (having a peak voltage of $VP_{ACTUAL}$) within $(VP_{ACTUAL}-V_{OV})(1-1/\sqrt{1})$.

Furthermore, the transistors M1-M5 can be configured so that $V_{OV}$ is equal to $VP_{TARGET}$, or $V_{OV}=VP_{TARGET}$, so that equation (2) may be re-written as the following equation (3):

$$PKO = \frac{VP_{ACTUAL}}{\sqrt{2}} + \left(1 - \frac{1}{\sqrt{2}}\right)VP_{TARGET} \quad (3)$$

In this manner, when the actual peak voltage $VP_{ACTUAL}=VP_{TARGET}$, then PKO=$VP_{ACTUAL}$ according to equation (3). In other words, when $VP_{ACTUAL}=VP_{TARGET}$ and $V_{OV}$ is set to equal $VP_{TARGET}$, then the peak detector 218 asserts its output PKO=$VP_{ACTUAL}$ in the worst case observation time when observed at the 3 dB down point. It is appreciated that $VP_{ACTUAL}$ varies relative to $VP_{TARGET}$, which is at least one reason for providing an AGC loop. The receiver chain 200 is configured so that $VP_{ACTUAL}$ may vary within an acceptable tolerance of $VP_{TARGET}$ to achieve fast AGC settling.

Assume, for example, that it is desired to accurately detect $VP_{ACTUAL}$ when within the voltage range of $VP_{TARGET}/1.5 \leq VP_{ACTUAL} \leq 1.5*VP_{TARGET}$. When $VP_{ACTUAL}=VP_{TARGET}$, then it is desired to maintain the gain of the AGC loop. The conventional configuration, however, asserts PKO 3 dB below $VP_{ACTUAL}$, and the AGC loop responds by increasing the gain by a substantial amount potentially saturating the input. The peak detector 218 configured according to equation (3), however, accurately asserts PKO=$VP_{ACTUAL}$, so that the AGC loop settles very quickly.

A worst case condition occurs when $VP_{ACTUAL}=1.5*VP_{TARGET}$, which is about 3.5 dB above the target level. In the conventional case, when observed at the 3 dB down point, the measured peak output is only about 0.5 dB greater than the target level, so that the AGC loop may respond by reducing the gain only by a minimal amount or not at all, certainly much less than is desired. Such inaccurate measurement may cause an increased AGC settling time. For the the peak detector 218 configured according to equation (3), however, PKO is asserted to about $1.35*VP_{TARGET}$, which is only about 0.9 dB too low as compared to 3 dB too low, so that the measurement error is substantially reduced. The AGC loop may settle much faster.

When $VP_{ACTUAL}$ is lower than $VP_{TARGET}$, the conventional configuration asserts PKO 3 dB below $VP_{ACTUAL}$, and the AGC loop may respond by increasing the gain by a substantial amount potentially overshooting $VP_{TARGET}$. This significantly increases AGC settling time. The peak detector 218, however, tends to measure the peak higher than its actual peak level when $VP_{ACTUAL}$ is lower than $VP_{TARGET}$ and when two of the inputs are equal. For example, when $VP_{ACTUAL}$ is as low as $VP_{TARGET}/1.5=0.6666*VP_{TARGET}$, then, according to equation (3), the peak detector 218 asserts PKO $0.7643*VP_{TARGET}$, which is about 1.19 dB too high. In this case, the error is substantially less than 3 dB, and rather than measuring way too low, the peak is measured just above its actual value. In this case, the AGC loop may apply slightly less gain than necessary to achieve $VP_{TARGET}$ in the current iteration. Nonetheless, the gain is increased to bring the input signal substantially closer to the $VP_{TARGET}$, so that the AGC loop settles much more quickly as compared to the conventional configuration without overshooting $VP_{TARGET}$ and without any danger of clipping the input signal.

It is noted that alternative configurations of the peak detector 218 are contemplated. For example, the peak detector 218 may be implemented with opposite polarity devices, such as, for example, every N-type device is replaced with a P-type device and vice-versa and the proper supply voltage and grounding schemes are applied.

Figure 4:
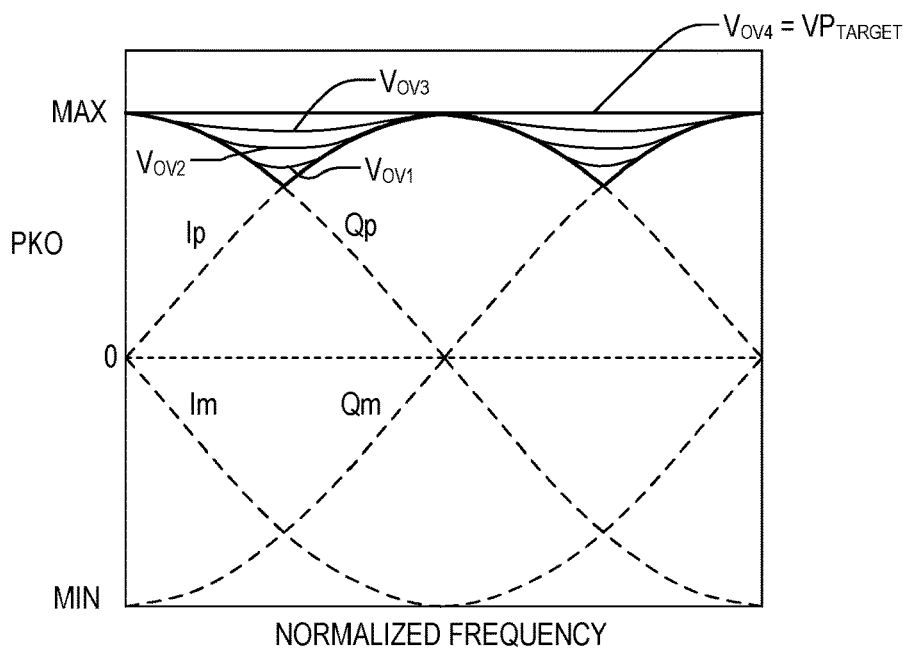
FIG. 4 is a graphic diagram plotting peak detector output for various values of the gate overdrive voltage for a half cycle of the in-phase and quadrature signals in sinusoidal form with normalized frequency and normalized voltage having a peak voltage equal to a target peak voltage.

FIG. 4 is a graphic diagram plotting PKO for various values of the gate overdrive voltage $V_{OV}$ that are lower or equal to target level, $VP_{TARGET}$, for a half cycle of the in-phase and quadrature signals in sinusoidal form with normalized frequency and normalized voltage (from MIN to MAX centered at 0) having a peak voltage VP=MAX=$VP_{TARGET}$. It is assumed that the in-phase and quadrature signals have much longer periods (or equivalently low frequency signals) than the observation period; if the observation period captures at least one-fourth period of the input, then the actual peak is accurately measured. The in-phase and quadrature signals are shown using dashed lines except that a maximum one of the in-phase and quadrature signals is shown as a bold line following an upper envelope of the in-phase and quadrature signals. Each PKO plot is shown for different values of $V_{OV}$, shown as $V_{OV1}$, $V_{OV2}$, $V_{OV3}$ and $V_{OV4}$, in which $V_{OV4}$ is equal to $VP_{TARGET}$. When VP=$V_{OV}$=$VP_{TARGET}$, which is the case for $V_{OV4}$, the output voltage PKO follows VP, or PKO=VP=$VP_{TARGET}$. When $V_{OV}$ varies from $VP_{TARGET}$, PKO may vary but not as much as the conventional configuration.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An electronic circuit including a peak detector, wherein said peak detector comprises:
    an input circuit comprising first, second, third, and fourth transistors of a first conductivity type, each having a first current terminal coupled to a control node, each having a second current terminal coupled to a bias node, and each having a control terminal receiving a corresponding one of first and second in-phase signals and first and second quadrature signals, and a fifth transistor of said first conductivity type having a first current terminal coupled to a current node, having a second current terminal coupled to said bias node, and having a control terminal coupled to an output node, and wherein said first, second, third, fourth, and fifth transistors of said first conductivity type have the same size;
    a bias circuit coupled between said bias node and a source reference voltage node that establishes a predetermined bias current from said bias node to said source reference voltage node;
    a current mirror coupled to a source voltage node, said current node and said control node, wherein said current mirror mirrors current flowing through said fifth transistor of said first conductivity type from said current node and into said first, second, third, and fourth transistors of said first conductivity type via said control node; and
    an output circuit comprising a first transistor of a second conductivity type having a first current terminal coupled to said source voltage node, having a second current terminal coupled to said output node, and having a control terminal coupled to said control node, and comprising a capacitor coupled between said output node and said source reference voltage node.

2. The electronic circuit of claim 1, wherein said current mirror comprises:
    a second transistor of said second conductivity type having a first current terminal coupled to said source voltage node, having a second current terminal coupled to said control node, and having a control terminal coupled to said current node; and
    a third transistor of said second conductivity type having a first current terminal coupled to said source voltage node, and having a second current terminal and a control terminal coupled together at said current node.

3. The electronic circuit of claim 1, wherein said bias circuit comprises a sixth transistor of said first conductivity type having a first current terminal coupled to said bias node, having a second current terminal coupled to said source reference voltage node, and having a control terminal receiving a bias voltage.

4. The electronic circuit of claim 1, wherein said first conductivity type comprises N-type and wherein said second conductivity type comprises P-type.

5. The electronic circuit of claim 1, wherein said first and second in-phase signals comprise a positive in-phase signal and a negative in-phase signal, and wherein said first and second quadrature signals comprise a positive quadrature signal and a negative quadrature signal.

6. The electronic circuit of claim 1, wherein said first, second, third, fourth, and fifth transistors of said first conductivity type comprise MOS transistors having the same channel width and the same channel length.

7. The electronic circuit of claim 1, wherein said first, second, third, fourth, and fifth transistors of said first conductivity type are each configured to have a gate overdrive voltage that is equal to a target peak voltage of at least one of said in-phase and quadrature signals.

8. The electronic circuit of claim 1, wherein when one of said first and second in-phase signals and one of said first and second quadrature signals are both at a lower voltage that is 3 decibels below an actual peak voltage of said in-phase and quadrature signals, a voltage of said output node is closer to said actual peak voltage than to said lower voltage.

9. The electronic circuit of claim 8, wherein said actual peak voltage is $VP_{ACTUAL}$ and said first, second, third, fourth, and fifth transistors of said first conductivity type are each configured to have a gate overdrive voltage $V_{OV}$, and wherein said voltage of said output node is $(VP_{ACTUAL}/\sqrt{2})+V_{OV}(1-\sqrt{2})$ when a period of said in-phase and quadrature signals is substantially longer than an observation time of the peak detector.

10. The electronic circuit of claim 9, wherein said voltage of said output node is substantially equal to $VP_{ACTUAL}$ when $VP_{ACTUAL}$ is substantially equal to a target peak voltage $VP_{TARGET}$ and when said gate overdrive voltage $V_{OV}$ is configured such that $V_{OV}=VP_{TARGET}$.

11. The electronic circuit of claim 1, wherein said in-phase and quadrature signals have an actual peak voltage of $VP_{ACTUAL}$ and wherein said first, second, third, and fifth transistors of said first conductivity type are each configured to have a gate overdrive voltage $V_{OV}$, said output node has a voltage that follows $VP_{ACTUAL}$ within $(VP_{ACTUAL}-V_{OV})(1-\sqrt{2})$.

12. The electronic circuit of claim 1, further comprising a quantizer that converts a voltage developed on said output node to a digital value.

13. The electronic circuit of claim 1, further comprising:
    a radio frequency front-end that receives and converts a radio signal into differential in-phase signals and quadrature phase signals;
    a first programmable gain amplifier that amplifies said differential in-phase signals into said first and second in-phase signals; and
    a second programmable gain amplifier that amplifies said quadrature phase signals into said first and second quadrature phase signals;
    wherein a peak value developed on said output node is used to control a gain of said first and second programmable gain amplifiers.

14. A method of detecting a peak level of in-phase and quadrature phase sinusoidal differential signals, comprising:
    providing a corresponding one component of the in-phase and quadrature phase sinusoidal differential signals to a control terminal of a corresponding one of first, second, third, and fourth transistors of a first conductivity type having a common size and having current terminals coupled in parallel between a control node and a bias node;
    coupling current terminals of a fifth transistor of the first conductivity type between a current node and the bias node and coupling a control terminal of the fifth transistor to an output node, wherein the fifth transistor is the same size as the first, second, third, and fourth transistors of the first conductivity type;
    drawing a predetermined bias current from the bias node;
    mirroring a current flowing through the current terminals of the fifth transistor of the first conductivity type and through the current terminals of the first, second, third, and fourth transistors of the first conductivity type;

coupling current terminals of a first transistor of a second conductivity type between a source voltage node and the output node and coupling a control terminal of the first transistor of the second conductivity type to the control node; and coupling a capacitor between the output node and a reference node.

15. The method of claim 14, wherein said providing comprises providing a positive in-phase signal to the first transistor of the first conductivity type, providing a negative in-phase signal to the second transistor of the first conductivity type, providing a positive quadrature signal to the third transistor of the first conductivity type and providing a negative quadrature signal to the fourth transistor of the first conductivity type.

16. The method of claim 14, further comprising configuring a gate overdrive voltage of the first, second, third, fourth, and fifth transistors of the first conductivity type to be equal to a target peak voltage of the in-phase and quadrature phase sinusoidal differential signals.

17. The method of claim 14, further comprising providing the first, second, third, fourth, and fifth transistors of the first conductivity type as N-type MOS transistors.

18. The method of claim 17, wherein said coupling current terminals of a first transistor of a second conductivity type comprises coupling current terminals of a P-type MOS transistor between the source voltage node and the output node and coupling a gate terminal of the P-type MOS transistor to the control node.

19. The method of claim 14, further comprising quantizing a voltage of the output node to a digital value.

20. The method of claim 14, further comprising:
receiving and converting a radio signal into differential in-phase signals and quadrature phase signals;
amplifying the differential in-phase signals and providing first and second in-phase signals to the first and second transistors of the first conductivity type;
amplifying the quadrature phase signals and providing first and second quadrature phase signals to the third and fourth transistors of the first conductivity type; and
using a peak value developed on the output node to control an amount of gain said amplifying.

* * * * *